US006735236B2

(12) United States Patent
Cybulski et al.

(10) Patent No.: US 6,735,236 B2
(45) Date of Patent: May 11, 2004

(54) HIGH POWER GAS DISCHARGE LASER WITH LINE NARROWING UNIT

(75) Inventors: Raymond F. Cybulski, San Diego, CA (US); Alexander I. Ershov, San Diego, CA (US); Eckehard D. Onkels, San Diego, CA (US); Palash P. Das, Vista, CA (US); Danilo K. Richardson, Escondido, CA (US); Jesse D. Buck, San Marcos, CA (US)

(73) Assignee: Cymer, Inc., San Diego, CA (US)

( * ) Notice: Subject to any disclaimer, the term of this patent is extended or adjusted under 35 U.S.C. 154(b) by 0 days.

(21) Appl. No.: 09/451,407

(22) Filed: Nov. 30, 1999

(65) Prior Publication Data

US 2002/0006147 A1 Jan. 17, 2002

Related U.S. Application Data

(63) Continuation-in-part of application No. 09/390,579, filed on Sep. 3, 1999, now Pat. No. 6,212,217.

(51) Int. Cl.[7] .............................. H01S 3/08; H01S 3/10
(52) U.S. Cl. ......................... 372/102; 372/20; 372/57; 372/99
(58) Field of Search ............................. 372/20, 57–60, 372/102, 99

(56) References Cited

U.S. PATENT DOCUMENTS

| 3,845,409 A | * 10/1974 | Wada et al. ................. 372/102 |
| 4,977,563 A | 12/1990 | Nakatani et al. ............... 372/32 |
| 5,095,492 A | 3/1992 | Sandstrom ................... 372/102 |

FOREIGN PATENT DOCUMENTS

| JP | 04-314374 | * 11/1992 | |
| JP | 05-167172 | * 7/1993 | |
| JP | 2696285 | 9/1997 | ........... H01S/3/137 |

OTHER PUBLICATIONS

Press, William H. et al., "Numerical Recipes, The art of Scientific Computing", Cambridge, University Press (1990), pp. 274–277, 289–293 and 312–321.

* cited by examiner

*Primary Examiner*—Hemang Sanghavi
(74) *Attorney, Agent, or Firm*—William Cray

(57) ABSTRACT

A grating based line narrowing device for line narrowing lasers producing high energy laser beams. Techniques are provided for minimizing adverse effects of hot gas layers present on the face of the grating.

In preferred embodiments a stream of gas is directed across the face of the grating. In other embodiments the effect of the hot gas layer is reduced with the use of helium as a purge gas and in other embodiments the purge gas pressure is reduced to reduce the optical effects of the hot gas layer.

18 Claims, 10 Drawing Sheets

HIGH POWER GAS DISCHARGE LASER WITH LINE NARROWING UNIT

This invention relates to lasers and in particular to high power gas discharge lasers with a grating based line narrowing unit. This invention is a continuation-in-part of Ser. No. 09/390,579, filed Sep. 3, 1999 now U.S. Pat. No. 6,212,217.

BACKGROUND OF THE INVENTION

Narrow Band Gas Discharge Lasers

Gas discharge ultraviolet lasers used a light source for integrated circuit lithography typically are line narrowed. A preferred line narrowing prior art technique is to use a grating based line narrowing unit along with an output coupler to form the laser resonance cavity. The gain medium within this cavity is produced by electrical discharges into a circulating laser gas such as krypton, fluorine and neon (for a KrF laser); argon, fluorine and neon (for an ArF laser); or fluorine and helium and/or neon (for an $F_2$ laser).

Prior Art Purge Technique

A sketch of such a prior art system is shown in FIG. 1 which is extracted from Japan Patent No. 2,696,285. The system shown includes output coupler (or front mirror) 4, laser chamber 3, chamber windows 11, and a grating based line narrowing unit 7. The line narrowing unit 7 is typically provided on lithography laser system as an easily replaceable unit and is sometimes called a "line narrowing package" or "LNP" for short. This unit includes two beam expanding prisms 27 and 29 and a grating 16 disposed in a Litrow configuration. Gratings used in these systems are extremely sensitive optical devices and deteriorate rapidly under ultraviolet radiation in the presence of oxygen in standard air. For this reason, the optical components of line narrowing units for lithography lasers are typically purged continuously during operation with nitrogen.

For many years, designers for line narrowed lasers have believed that distortions of the laser beam could be caused by gas flow near the face of the grating. Therefore, laser designers in the past have made special efforts to keep the purge nitrogen from flowing directly on the face of the grating. Several examples of these efforts are described in the Japan Patent 2,696,285 referred to above. In the example shown in extracted FIG. 1, the purge flow is directed from $N_2$ gas bottle 44 toward the back side of grating 16 through port 46.

Increased Repetition Rates

Line narrowed ultraviolet laser light sources currently in use in the integrated circuit industry typically produce about 10 mJ per pulse at repetition rates of about 1000 Hz and duty factors of about 20 percent. Increased integrated circuit production can be achieved at higher repetition rates and greater duty cycles. Applicants and their fellow workers have designed a 2000 Hz gas discharge lithography laser and several of these lasers have been sold for lithography use. Applicants are now experimenting with even higher repetition rates of up to 5000 Hz. Applicants have experienced difficulties maintaining consistent narrow bandwidths at these higher repetition rates and duty cycles.

A need exists for reliable line narrowing devices and techniques for high repetition rate, high duty cycle gas discharge lasers.

SUMMARY OF THE INVENTION

The present invention provides a grating based line narrowing device for line narrowing lasers producing high energy laser beams. Techniques are provided for minimizing adverse effects of hot gas layers present on the face of the grating.

In preferred embodiments a stream of gas is directed across the face of the grating. In other embodiments the effect of the hot gas layer is reduced with the use of helium as a purge gas and in other embodiments the purge gas pressure is reduced to reduce the optical effects of the hot gas layer.

DETAILED DESCRIPTION OF PREFERRED EMBODIMENTS

Laser Performance at High Average Power

A prior line narrowed KrF excimer laser operating at relatively low average power, typically less than 5W will produce a laser beam centered at about 248 nm with a bandwidth of less than 0.6 pm. The laser can run at high rep rate, up to 2000 Hz and even above that as long as average power is below 5W. A typical lithography KrF excimer laser has a pulse energy of 10 mJ. Therefore, in order to keep the average power low, it has to be operated with a relatively low duty cycle. For example, it can be run at 2 kHz in bursts of 200 pulses with pause between bursts of about 0.45. Such an operation will produce an average power of:

$$P_{ave} = \frac{10 \text{ mJ} \cdot 200 \text{ pulses}}{0.5 \text{ sec}} = 4W \tag{1}$$

Problems with bandwidth control start to appear when the average power is increased. This happens, for example, when the interburst delay is decreased. For example, laser running the same 200 pulse bursts with 0.1 second interburst delay will have an average power of:

$$P_{ave} = \frac{10 \text{ mJ} \cdot 200 \text{ pulses}}{0.2 \text{ sec}} = 10W \tag{2}$$

At maximum, the laser is run in continuous mode which at 2000 Hz and 10 mJ pulse energy is equivalent to 20W average power.

When the prior art laser system is run with high average power, the bandwidth increases gradually over a period of about 5 to 20 minutes from initial bandwidth of less than 0.6 pm, and remains substantially higher than 0.6 pm. Such an increase in bandwidth should be avoided in microlithography production runs, because it will cause images to blur due to chromatic alterations of projection lenses. Another important application is when the laser is used to test thermal properties at high duty cycles of other lithography components, such as the projection lens itself. In this application, the laser is supposed to maintain its bandwidth and other parameters within the specification during the duration of the test.

The bandwidth transient can be corrected somewhat using a special bandwidth control device.

Figure 1:
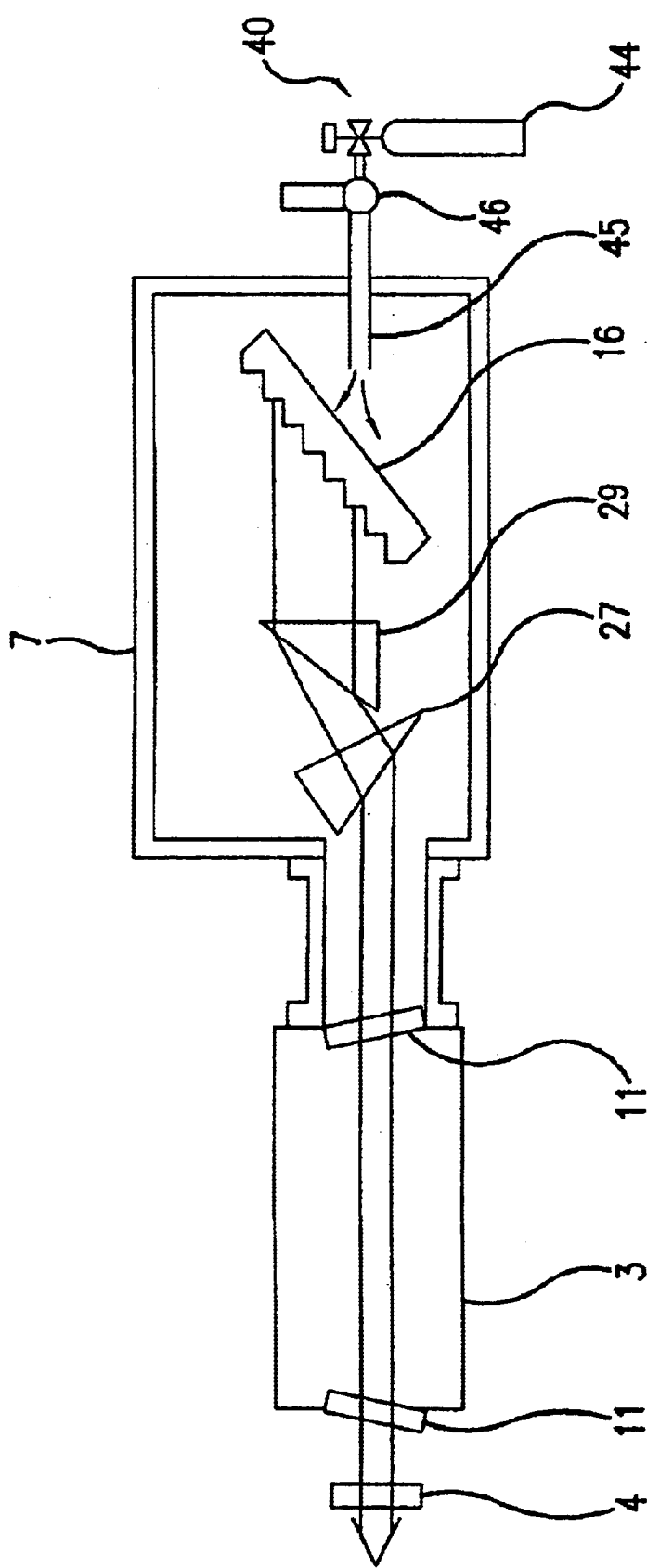
FIG. 1 shows a first prior art line narrowed laser system.
Figure 2:
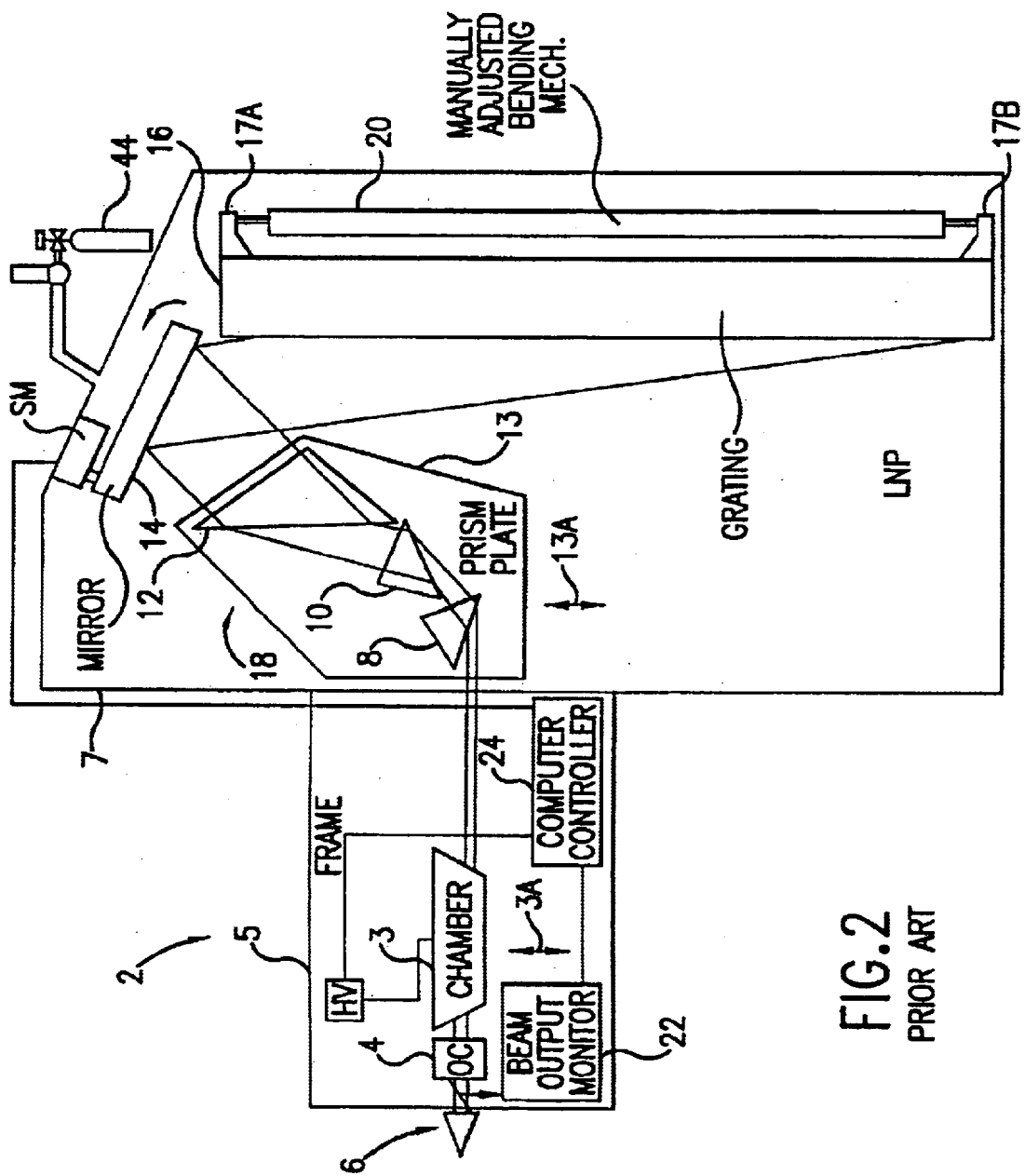
FIG. 2 shows a second prior art line narrowed laser system.

FIG. 2 is a sketch showing a prior art line narrowing unit fabricated by Applicants' employer, Cymer, Inc., as a part of a prior art line narrowed lithography KrF laser system incorporating such a device. The unit includes three beams expanding prisms 8, 10 and 12, a tuning mirror 14 and a grating 16. Note that the nitrogen purge from bottle 44 enters the unit on the back side of the tuning mirror 46 to avoid purge flow directly on the grating face. In this system the wavelength of the laser beam 6 is controlled in a feedback arrangement in which the wavelength of the beam is measured by monitor 22 and computer controller 24 uses the wavelength information to adjust the angular position of tuning mirror 14 to control the wavelength to a desired value. The bandwidth control device 20 is used to mechanically bend grating 16 to make it slightly concave, for example. This device is described in detail in U.S. Pat. No. 5,095,492 assigned to Cymer. Use of this device permits reduction of the bandwidth somewhat, but it still goes out of specification when the laser is run at high duty cycle.

Figure 3:
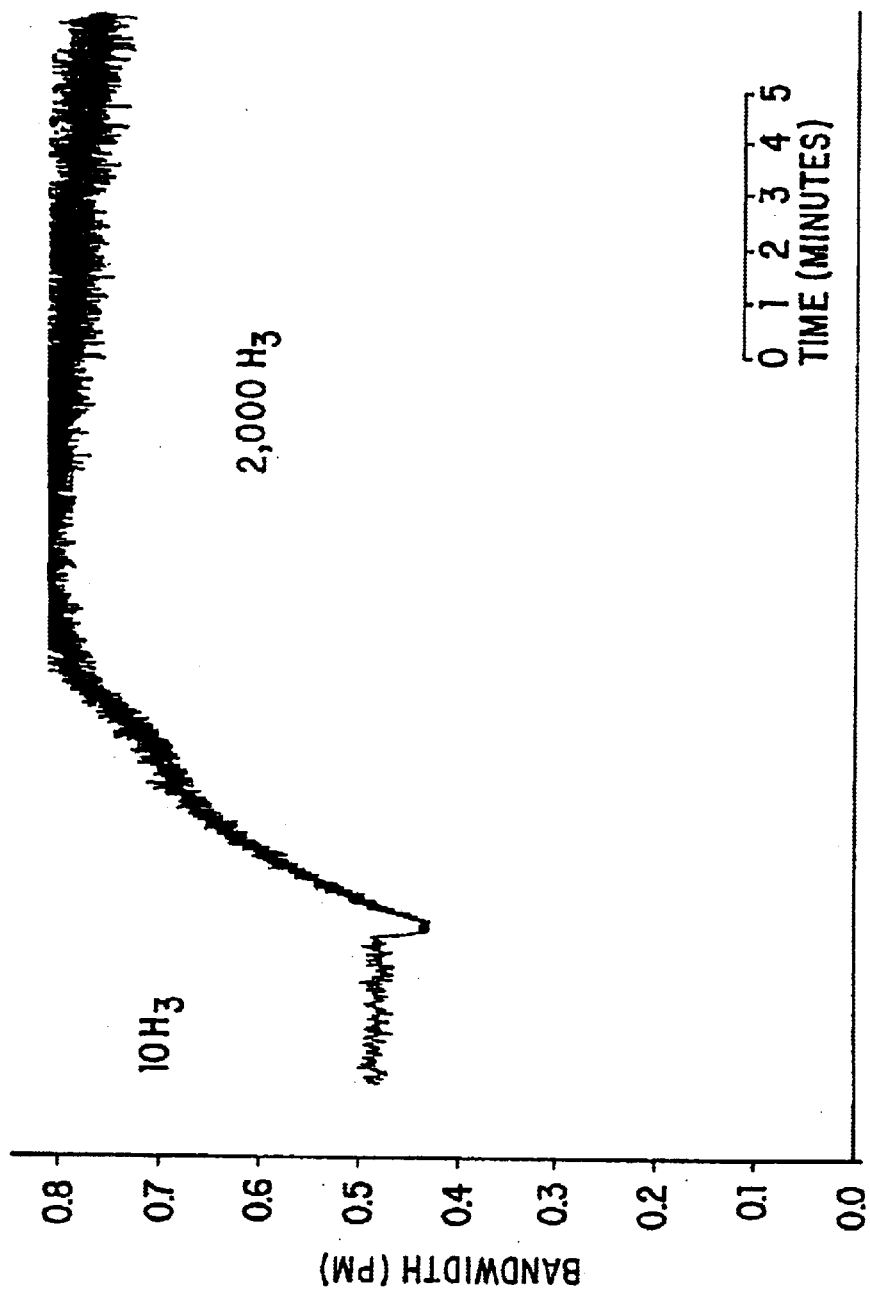
FIG. 3 shows adverse effects on bandwidth of a hot gas layer on the face of a line narrowing grating.

FIG. 3 shows one of such examples, when the bandwidth goes out of specification in prior art laser run at 20W average power (10 mJ, 2000 Hz continuous operation). Also, the bandwidth control device can be optimized for one specific mode of operation, but lithography lasers must be able to be run in several different modes. For example, a typical operating mode might be as follows:

(1) a burst of 600 pulses 10 mJ pulses at 2000 Hz for 0.3 seconds, (2) idle for 0.3 seconds (3) repeat (1) and (2) for 85 bursts and (4) idle for 9 seconds.

Hot Nitrogen Layer

Applicants have determined that the poor performance at higher repetition rates as shown in FIG. 3 is the result of the development of a hot layer of nitrogen which builds up over a period of about 5 minutes on the face of the grating 48.

Figure 9:
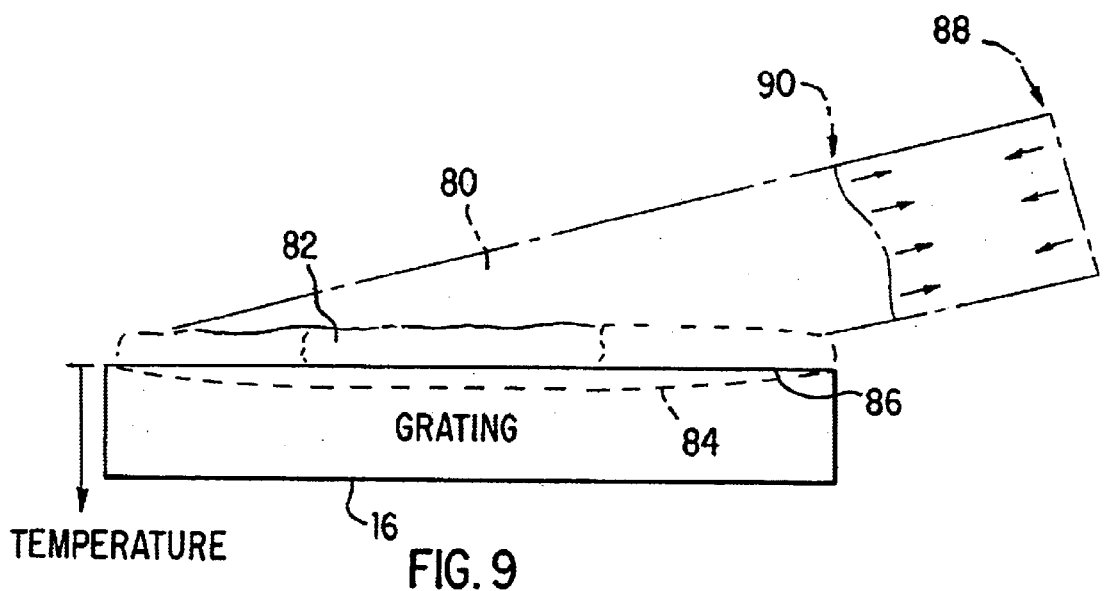
FIG. 9 shows the heating of the gas layer on the grating surface.

This hot gas is heated by the grating surface, which in turn is heated by absorbing a portion of incident laser beam. Typically, as much as 15 to 20% of incident light might be absorbed by grating surface. The surface temperature of the grating might rise to 10 to 15° C. This temperature increase is non-uniform, it is higher in the middle of the grating and lower at the ends as shown in FIG. 9. Therefore, the air in front of the middle portion of the grating is hotter than the air in front of the edges. Therefore, when the laser beam 80 incidents on the grating surface 86 it goes through this boundary layer 82. Because this air has the same pressure, the hotter the air, the less its density is. So, the air near the center of the grating is less dense, than the air near the edges. Because of that, the laser beam 80 will have different phase shifts when it goes to the middle portion of the grating and edges. So, the incoming beam with parallel wavefront 88 will have a curved wavefront 90, corresponding to divergent beam. This happens even if grating 16 is perfectly flat.

Applicants have developed preferred modifications to the line narrowing unit to substantially eliminate this hot nitrogen layer.

Flow Across Grating Face

Figure 4A:
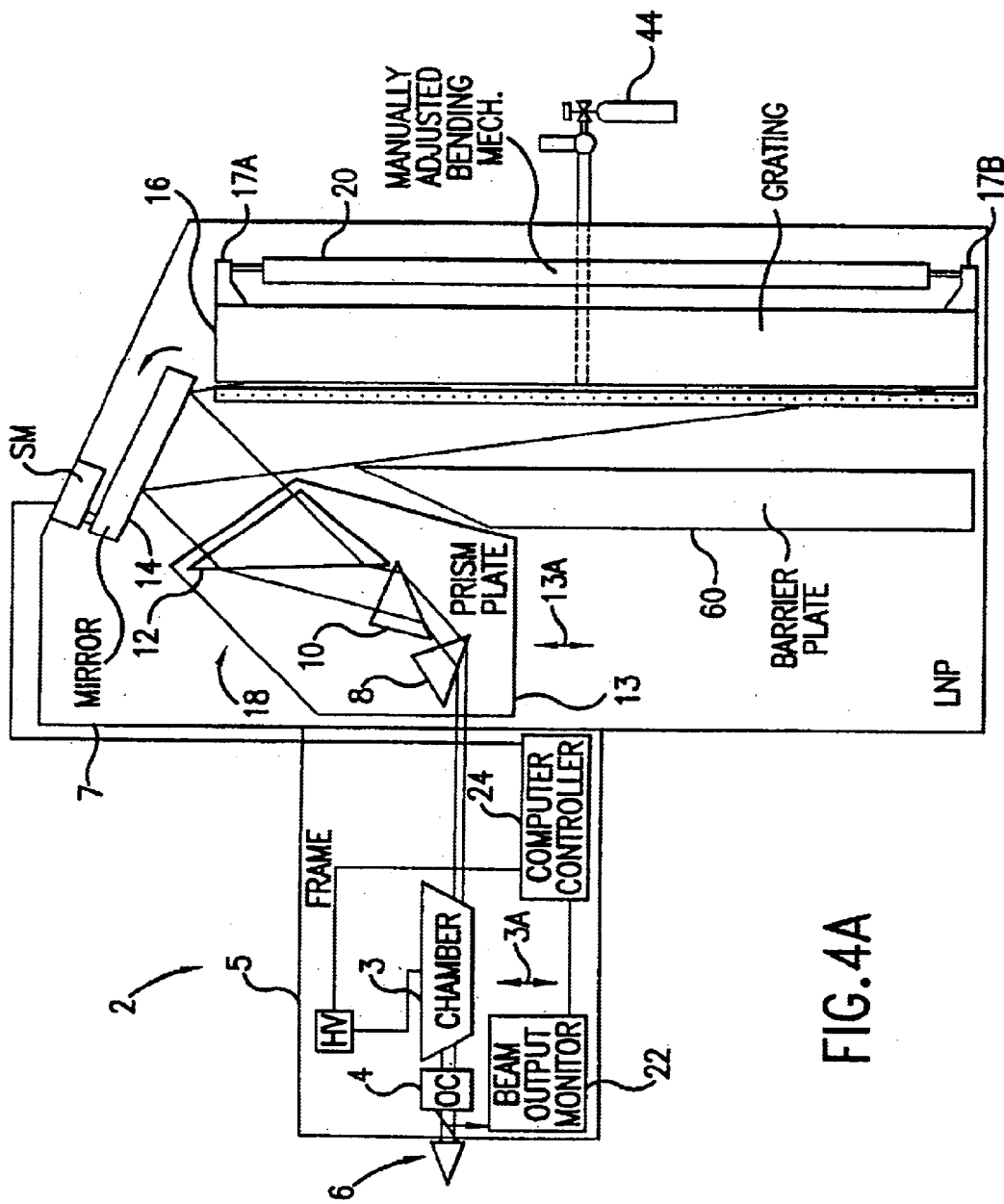
FIGS. 4A and 4B show a preferred embodiment of the present invention.
Figure 4B:
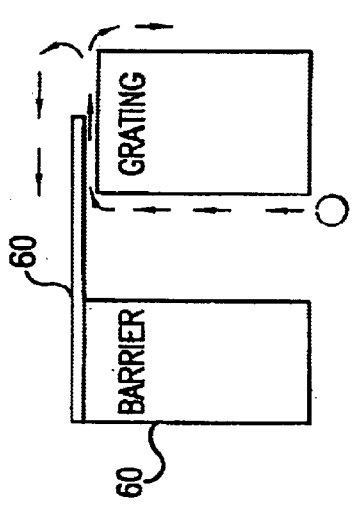
Figure 5A:
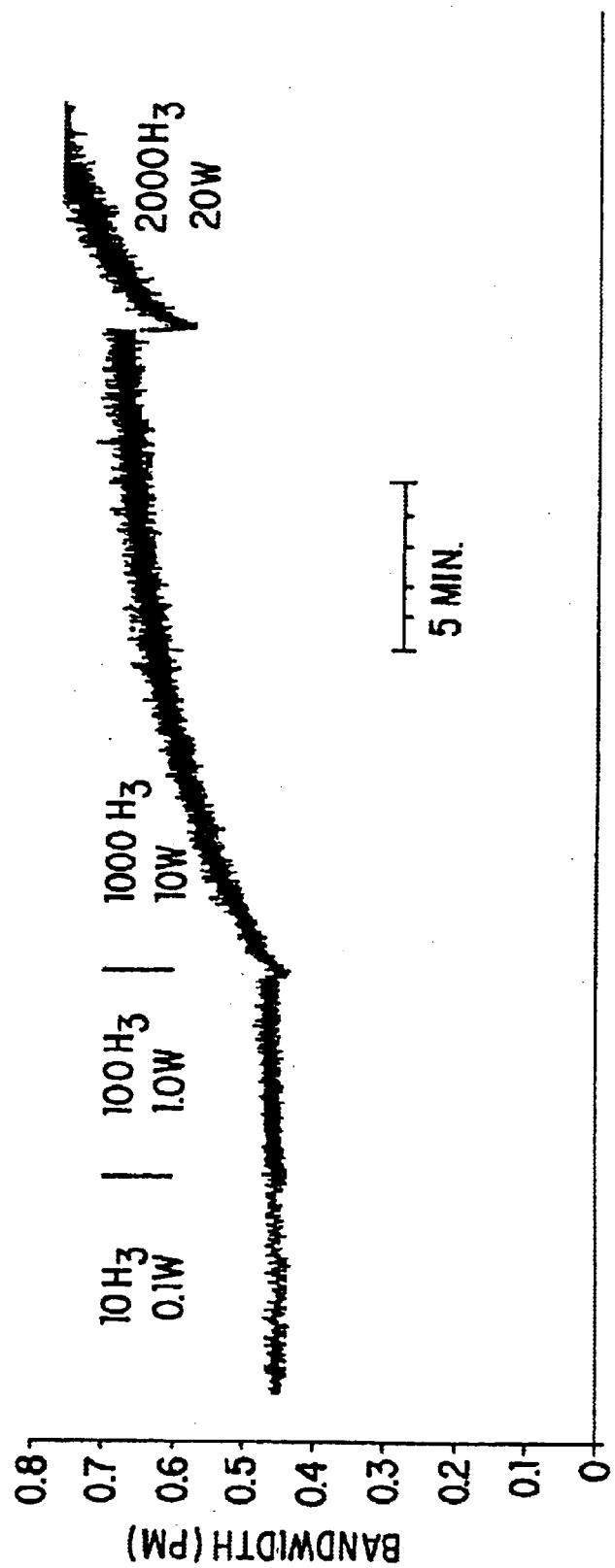
FIG. 5A shows bandwidth traces at various rep rates with prior art purging.
Figure 5B:
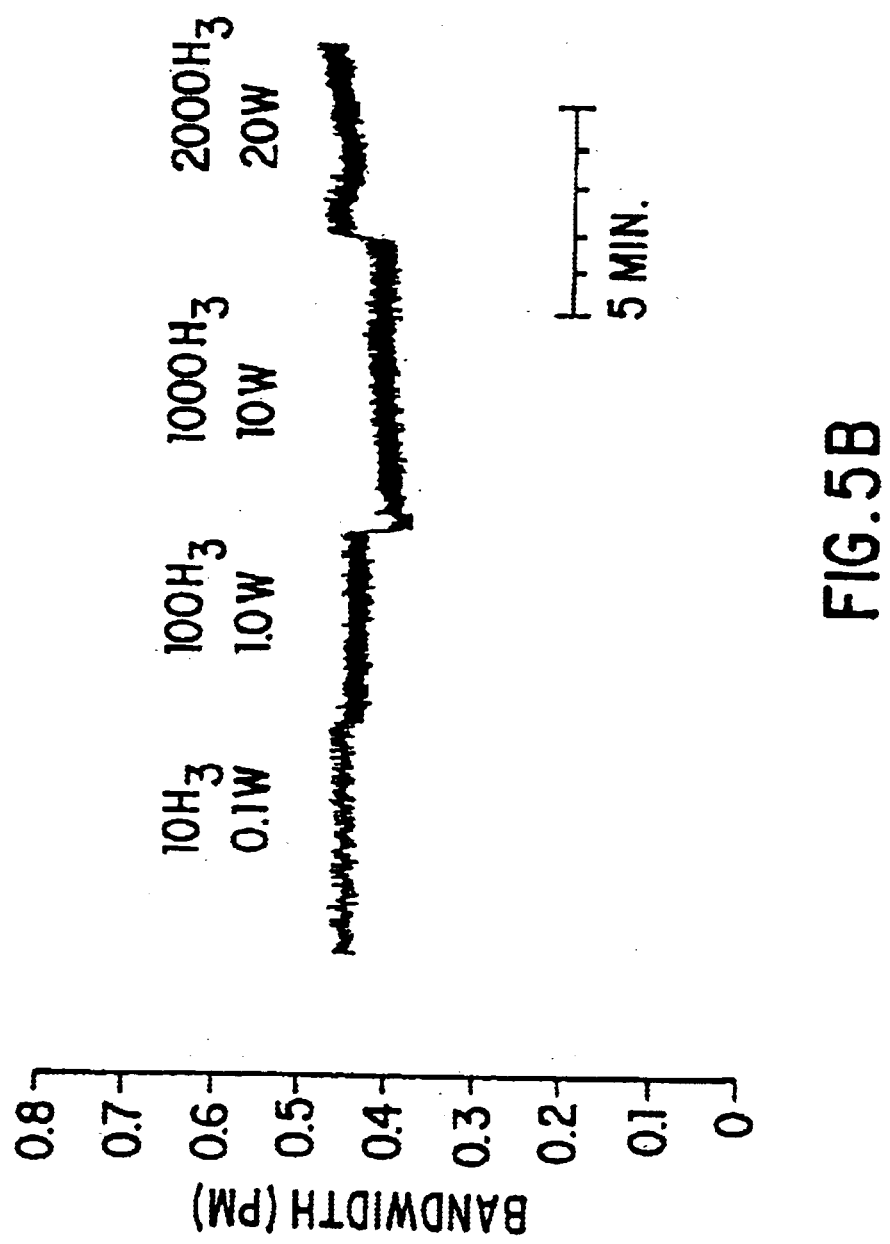
FIG. 5B shows bandwidth traces at various rep rates with purging in accordance with the present invention.

A first preferred embodiment of the present invention is shown in FIGS. 4A and 4B. In this case the nitrogen purge of about 2 liters per minute is flowed upward through approximately 1 mm diameter holes spaced at ¼ inch in a 10 inch long ⅜ inch ID tube functioning as a purge gas manifold. Barrier plate 60 and barrier cover 62 force most of the nitrogen purge flow in the direction shown by the arrows in FIG. 4B. This arrangement has produced excellent results as shown by the chart in FIG. 5. In this case, an increase in the output average power from 0.1W to 20W resulted in variations within 0.4 to 0.5 pm. It is interesting to note that at 10W average power, the bandwidth is actually slightly smaller than at 0.1 W.

It is important that the purge flow across the face of the grating be carefully controlled to avoid flow related distortions. Applicants have tested various flow rates and have determined that excessive flow can do more harm than good. For example, a flow rate of 20 liters per minute produced very poor results. Recommended flow rates are in the range of about 0.5 liters per minute to about 10 liters per minute.

It is also important to note, that this purge does not substantially reduce the temperature of the grating. The grating remains hot. What the purge does is to rather continuously displace air in front of the grating, so it does not have time to heat up by the grating. Very small flow rate and, correspondingly, gas velocity prevents any air distortions caused by the flow itself from affecting laser operation.

Other Purge Arrangements

Figure 6A:
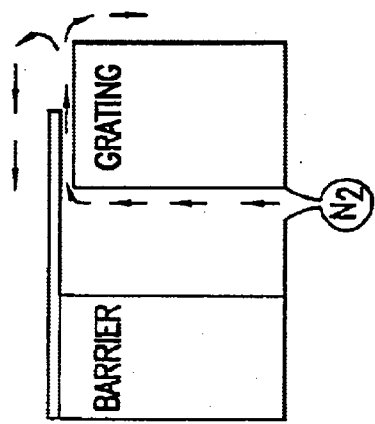
FIGS. 6A, 6B and 6C show alternate embodiments of the present invention.
Figure 6C:
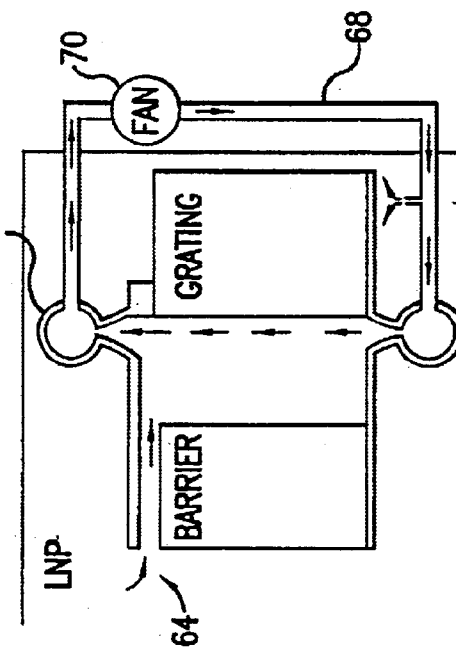
Figure 6B:
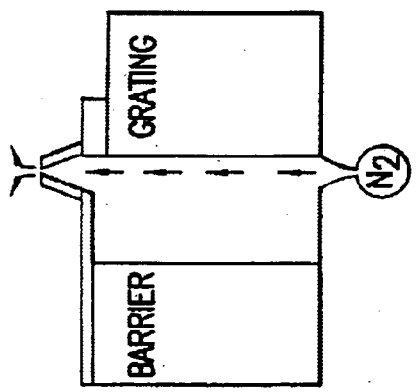

There are many potential arrangements to provide gas flow across the face of the grating to prevent the buildup of the thermal layer which causes the problem shown in FIG. 3. For example, a narrow slit of about 0.5 mm running the length of the manifold could be used instead of the small holes. Also smoother flow could be provided with a slit type nozzle such as shown in cross section in FIG. 6A or slit nozzles could be provided both at the top and bottom of the grating as shown in FIG. 6B. Also, flow across the grating face could be provided with a very small fan in a semi-closed system as shown in FIG. 6C. In this case, the regular nitrogen purge could be provided as in the prior art as shown in FIG. 2. In the FIG. 6C embodiment, the cavity between the grating and the barrier is not sealed and purge gas in permitted to circulate into and out of the cavity as shown at 64 and 66. The tubes 68 leading to and from fan 70 connect near the center of slitted tubes 72 and 74 which is just above and below the hottest area on grating 16.

Reduced Gas Pressure

A second solution to the hot gas layers problem is to reduce the gas pressure in the line narrowing package.

Gas convection modulates the gas density spatially, causing an inhomogeneous distribution of the refractive index, which in turn leads to phase front aberration. The magnitude of any aberration caused by gas density fluctuations, which are due to the gas convection close to the heated grating surface, is approximately linearly dependant on the nominal value of the susceptibility or the refractive index and thus the gas density.

Convective cooling of the surface of the grating and other optical components is not substantially reduced so long as the mean free path of the gas molecules is not less than distances between the "hot" and "cold" surfaces in the LNP. If we assume these distances are about 10 cm then as a rule of thumb we would say that the gas pressure should not be reduced beyond the pressure where the mean free path length is about 10 cm. That pressure is in the range of about 1 to 10 millibar so that the density of the gas in the LNP is about 0.1 to 1.0 percent the density at atmospheric conditions.

Figure 10:
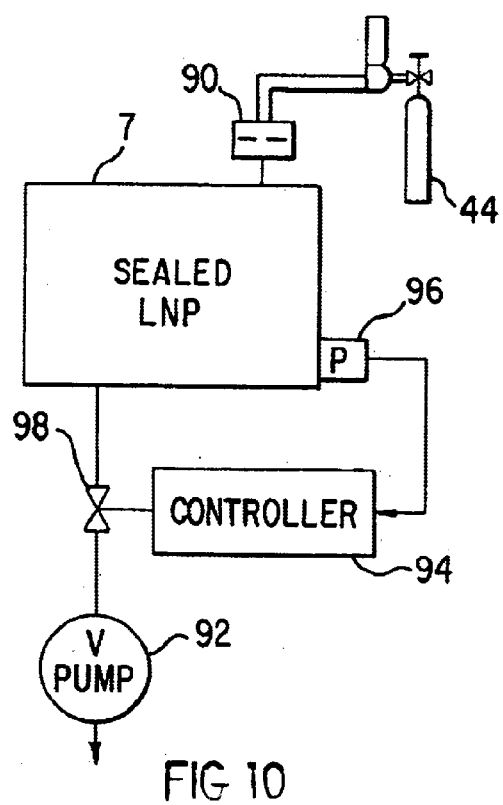
FIG. 10 shows a technique for reducing the purge gas pressure.

FIG. 10 is a sketch showing a system for maintaining a controlled pressure in the LNP at about 1 to 10 millibar. The nitrogen enters sealed LNP 7 through orifice 90. Vacuum pump 92 is used to create the vacuum in the LNP and the desired vacuum is maintained by controller 94 using a feedback signal from pressure sensor 96 to control needle valve 98. Since LNP is a sealed system and the pressure is approximately at equilibrium, sensor 96 may be thermocoupled.

Purge With Helium

Another solution to reduce the hot layer effect is to purge the LNP with helium. Helium has a smaller differential refractive index so that a hot layer will cause less distortion. In addition, helium has much better heat transfer properties than nitrogen. Argon may also be used with the same advantages. Helium, however, is much more expensive than nitrogen.

Figure 7:
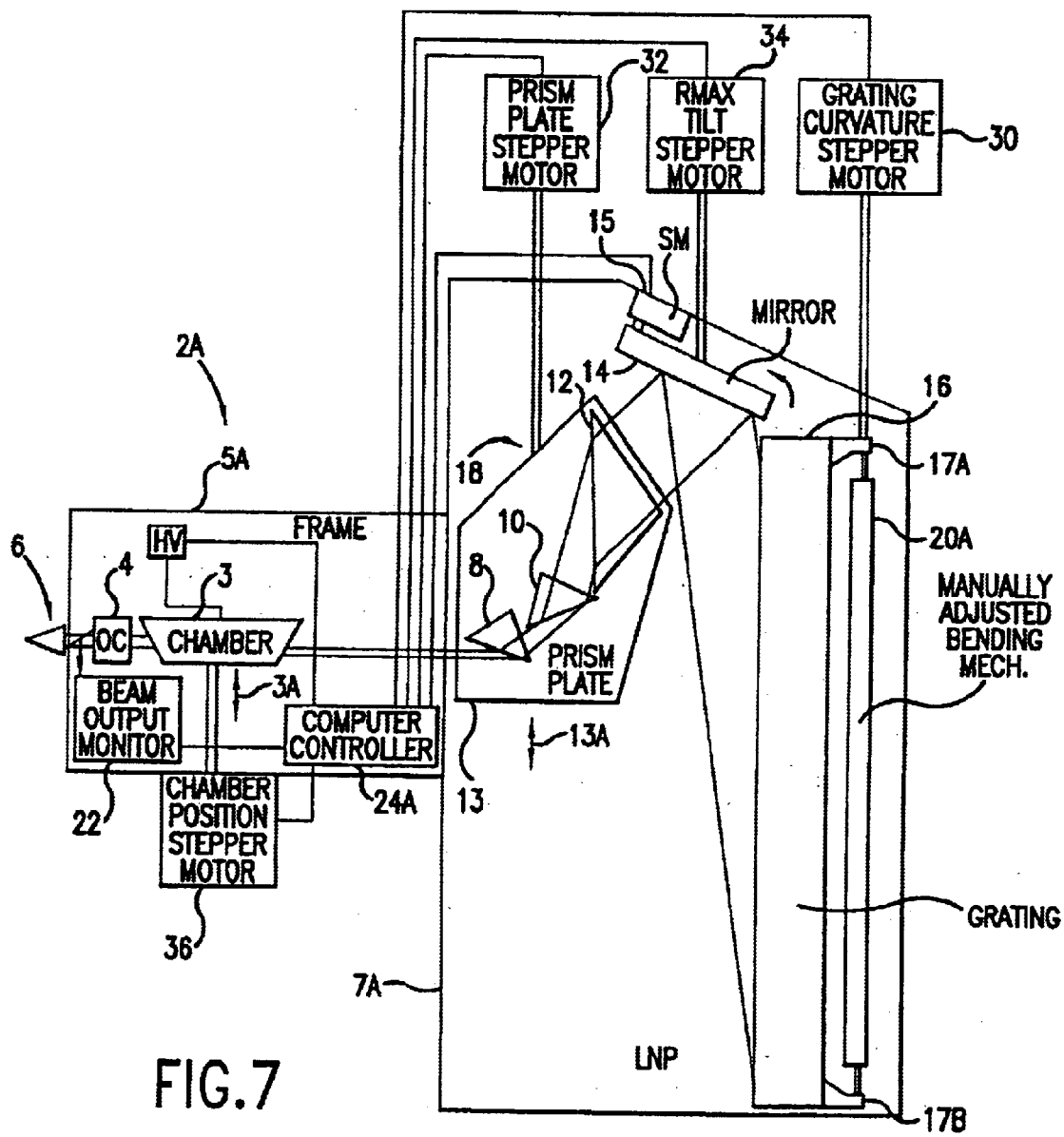
FIGS. 7 and 8 show a LNP equipped for fast feedback control.
Figure 8:
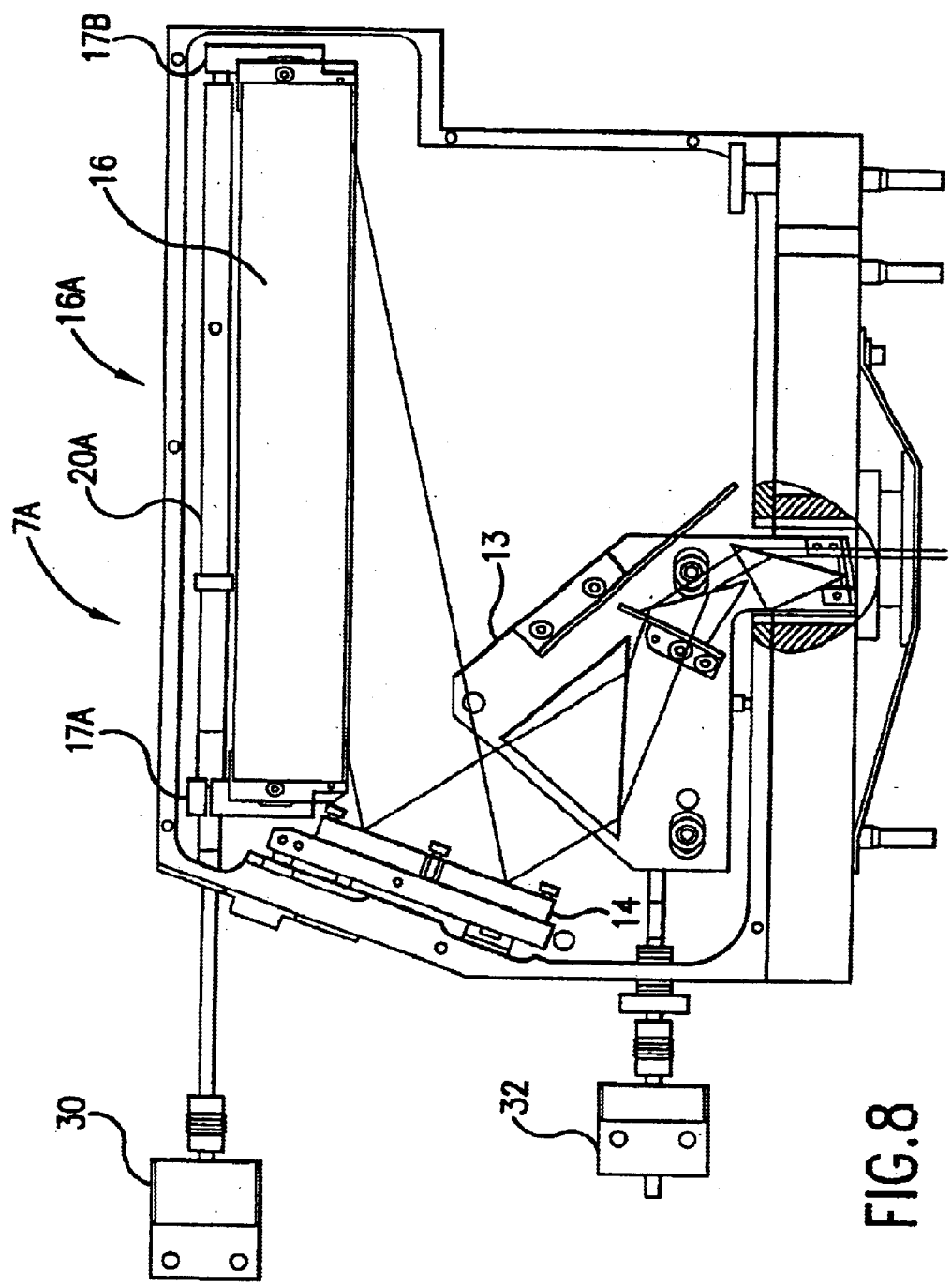

Persons skilled in the art will recognize that in addition to the above-described specific embodiments of the present invention, there are many other embodiments possible to deal with distortions caused by the hot gas layer. Another technique for dealing with the hot gas layer is to provide active bandwidth control to correct for the adverse effects of the hot gas layer. Techniques for substantially real time control of several wavelength parameters are described in a United States patent application filed Sep. 3, 1999, Ser. No. 09/390,579 which is incorporated by reference herein. These techniques include fast feedback control of the position of the beam expanding prisms, grating curvature and tuning mirror position. Control of the position of the laser chamber is also provided. FIG. 7 is a combination block diagram schematic drawing of the entire laser system and FIG. 8 is a drawing of the LNP with the added feedback control features. In this embodiment, the curvature of the grating is controlled by grating curvature stepper motor 30 to compensate for the distortion caused by the hot gas layer on the face of the grating. Therefore, the scope of the present invention should be determined by the appended claims and their legal equivalents.

We claim:

1. A grating based line narrowing device for line narrowing a laser producing high energy laser beams, said device comprising:
   (A) a grating defining a grating face,
   (B) a chamber for housing at least said grating,
   (C) a purge means for providing a purge gas for purging said chamber,
   (D) a beam expanding means for expanding a beam from said laser to produce an expanded beam,
   (E) a tuning means for directing said expanded beam onto the grating face in order to select from said expanded beam a desired range of wavelengths, wherein said expanded beam heats said grating face producing a temperature increase in said grating face which in turn heats purge gas in a purge gas layer adjacent to said grating face, and
   (F) a heat removal means comprising a purge gas flow of less than 20 liters per minute across said grating face remove heat from said purge gas layer to reduce optical distortion caused by said purge gas layer.

2. A device as in claim 1 wherein said heat removal means comprises a purge gas manifold having a plurality of small ports for directing purge gas across the grating face.

3. A device as in claim 2 wherein said heat removal means comprises a grating purge gas flow control means for controlling purge gas flow across the grating face.

4. A device as in claim 3 wherein said purge gas flow control means comprises structures defining a flow path across said grating face and then away from said grating face.

5. A device as in claim 1 wherein said heat removal means comprises a purge gas manifold having at least one long very narrow slot.

6. A device as in claim 5 wherein said slot is in the form of a long rectangular shaped nozzle.

7. A device as in claim 1 wherein said purge gas flow is about 2 liters per minute.

8. A device as in claim 1 wherein said purge gas is helium.

9. A device as in claim 1 and further comprising a vacuum pump for creating a vacuum in said chamber.

10. A device as in claim 9 wherein said vacuum is a pressure of about 1 to 10 millibars.

11. A device as in claim 9 wherein said vacuum is chosen so that gas molecules inside said chamber have a mean free path of between 5 cm and 30 cm.

12. A device as in claim 1 and further comprising a feedback grating curvature control mechanism for providing active control of curvature of said grating face.

13. A device as in claim 1 and further comprising a fan and at least one manifold configured to force a flow of gas across the grating face.

14. A method of bandwidth control of a narrow band gas discharge laser having a grating based line narrowing unit comprising:
   (A) a grating defining a grating face,
   (B) a chamber for housing at least said grating,
   (C) a purge means for providing a purge gas for purging said chamber,
   (D) a beam expanding means for expanding a beam from said laser to produce an expanded beam,
   (E) a tuning means for directing said expanded beam onto the grating face in order to select from said expanded beam a desired range of wavelengths, wherein said expanded beam heats said grating face producing a temperature increase in said grating face which in turn heats purge gas in a purge gas layer adjacent to said grating face, and
said method comprising the step of forcing a flow of gas at a flow rate of less than 20 liters per minute across said grating face.

15. The method as in claim 14 wherein said gas flow is between 0.5 and 10 liters per minute.

16. The method as in claim 14 wherein said gas flow is between 1 and 8 liters per minute.

17. A method as in claim 15 wherein said gas is helium.

18. A device as in claim 15 wherein said purge gas is helium.

* * * * *

UNITED STATES PATENT AND TRADEMARK OFFICE
CERTIFICATE OF CORRECTION

PATENT NO. : 6,735,236 B2
DATED : May 11, 2004
INVENTOR(S) : Raymond F. Cybulski et al.

It is certified that error appears in the above-identified patent and that said Letters Patent is hereby corrected as shown below:

Column 6,
Line 35, add the word -- the -- after the word "of"
Lines 64 and 65, delete the words "18. A device as in claim 15 wherein said purge gas is helium."

Signed and Sealed this

Seventh Day of June, 2005

JON W. DUDAS
*Director of the United States Patent and Trademark Office*

UNITED STATES PATENT AND TRADEMARK OFFICE
CERTIFICATE OF CORRECTION

PATENT NO. : 6,735,236 B2 Page 1 of 1
APPLICATION NO. : 09/451407
DATED : May 11, 2004
INVENTOR(S) : Cybulski et al.

It is certified that error appears in the above-identified patent and that said Letters Patent is hereby corrected as shown below:

<u>Column 5</u>:
Line 55, change "bearns" to --beam--;
Line 61, after "expanding" change "a" to --the--.

<u>Column 6</u>:
Line 5, after "said grating face" insert --to--.

Signed and Sealed this

Twelfth Day of September, 2006

JON W. DUDAS
*Director of the United States Patent and Trademark Office*

UNITED STATES PATENT AND TRADEMARK OFFICE
CERTIFICATE OF CORRECTION

PATENT NO. : 6,735,236 B2  
APPLICATION NO. : 09/451407  
DATED : May 11, 2004  
INVENTOR(S) : Cybulski et al.

Page 1 of 1

It is certified that error appears in the above-identified patent and that said Letters Patent is hereby corrected as shown below:

<u>Column 6:</u>
Line 2, after "gas in a" insert --heated--;
Line 6, alter "from said" insert --heated--;
Line 7, after "caused by said" insert --heated--;
Line 54, after "gas in a" insert --heated--.

Signed and Sealed this

Sixth Day of March, 2007

JON W. DUDAS
*Director of the United States Patent and Trademark Office*